United States Patent
Gupta et al.

(10) Patent No.: US 7,132,788 B2
(45) Date of Patent: Nov. 7, 2006

(54) OPTIMAL BANK SHAPES FOR INKJET PRINTING

(75) Inventors: Rahul Gupta, Santa Clara, CA (US); Andrew Ingle, Fremont, CA (US); Sriram Natarajan, Burlingame, CA (US); Stefan Grebler, Sunnyvale, CA (US)

(73) Assignee: Osram Opto Semiconductors GmbH, Regensburg (DE)

( * ) Notice: Subject to any disclaimer, the term of this patent is extended or adjusted under 35 U.S.C. 154(b) by 234 days.

(21) Appl. No.: 10/658,722

(22) Filed: Sep. 9, 2003

(65) Prior Publication Data

US 2005/0052120 A1   Mar. 10, 2005

(51) Int. Cl.
*H05B 33/14* (2006.01)
*H05B 33/00* (2006.01)
*H05B 33/10* (2006.01)
*H01L 51/50* (2006.01)
*H01L 51/56* (2006.01)

(52) U.S. Cl. ............... 313/504; 313/503; 313/506; 313/509; 445/24; 427/66

(58) Field of Classification Search ........... 313/503, 313/504, 506; 428/690; 445/24; 427/66; 257/40

See application file for complete search history.

(56) References Cited

U.S. PATENT DOCUMENTS

| | | | |
|---|---|---|---|
| 5,701,055 A | | 12/1997 | Nagayama et al. |
| 6,608,331 B1 * | 8/2003 | Duineveld | ............ 257/93 |
| 6,624,567 B1 * | 9/2003 | Nagayama et al. | ......... 313/503 |
| 6,692,845 B1 * | 2/2004 | Maruyama et al. | ......... 428/690 |
| 6,939,732 B1 * | 9/2005 | Birnstock et al. | ............ 438/22 |
| 7,022,534 B1 * | 4/2006 | Gupta et al. | ............. 438/21 |
| 2001/0017516 A1 | 8/2001 | Guenther | |
| 2002/0060518 A1 | 5/2002 | Duineveld et al. | |
| 2003/0227255 A1 | 12/2003 | Auch et al. | |
| 2004/0104385 A1 | 6/2004 | Lim et al. | |
| 2005/0190253 A1 * | 9/2005 | Duineveld et al. | ......... 313/504 |
| 2006/0125385 A1 * | 6/2006 | Lu et al. | ............ 313/506 |

FOREIGN PATENT DOCUMENTS

| | | | |
|---|---|---|---|
| EP | 982974 A1 * | 3/2000 | |
| WO | WO9912398 A1 * | 3/1999 | |
| WO | WO 200139272 A1 * | 5/2001 | |

OTHER PUBLICATIONS

Ewald Guenther, "Patterning of Electrode in OLED Devices", U.S. Appl. No. 10/363,200, filed Jul. 16, 2003, 45 pp.

* cited by examiner

*Primary Examiner*—Mariceli Santiago
(74) *Attorney, Agent, or Firm*—Fish & Richardson P.C.

(57) ABSTRACT

The shapes of the photo-resist layer "banks" which define pockets for inkjet printing or other patterned processes are optimized to provide a more uniform drying profile for substances which are to be deposited in those pockets and dried therein. Preferably, the shapes of the banks are "mushroom" shaped such that a portion of the photo-resist layer overhangs the exposed lower electrode layer.

25 Claims, 10 Drawing Sheets

OPTIMAL BANK SHAPES FOR INKJET PRINTING

BACKGROUND

1. Field of the Invention

This invention relates generally to the art of thin film device processing and fabrication. More specifically, the invention relates to the fabrication of Organic Light Emitting Diode based displays and other electronic devices which use selective deposition.

2. Related Art

Display and lighting systems based on LEDs (Light Emitting Diodes) have a variety of applications. Such display and lighting systems are designed by arranging a plurality of photo-electronic elements ("elements") such as arrays of individual LEDs. LEDs that are based upon semiconductor technology have traditionally used inorganic materials, but recently, the organic LED ("OLED") has come into vogue for certain applications. Examples of other elements/devices using organic materials include organic solar cells, organic transistors, organic detectors, and organic lasers. There are also a number of bio-technology applications such as biochips for DNA recognition, combinatorial synthesis, etc. which utilize organic materials.

An OLED is typically comprised of two or more thin at least partially conducting organic layers (e.g., an electrically conducting hole transporting polymer layer and an emissive polymer layer where the emissive polymer layer emits light) which are sandwiched between an anode and a cathode. Under an applied forward potential, the anode injects holes into the conducting polymer layer, while the cathode injects electrons into the emissive polymer layer. The injected holes and electrons each migrate toward the oppositely charged electrode and recombine to form an exciton in the emissive polymer layer. The exciton relaxes to a lower energy state by emission of radiation and in process, emits light.

Each of the OLEDs can be a pixel element in a passive or active matrix OLED display. Such pixels can be arranged in a row-column fashion and would be addressed and switched on/off differently depending upon whether the display was active or passive matrix. In the passive matrix case, each pixel is not individually controlled by a transistor, but rather pixels are addressed using a combination of row lines and column lines. In active-matrix displays, each pixel is controlled by its own switch (e.g. transistor based) which allows it to remain on until switched off.

FIG. 1 illustrates a typical OLED based passive matrix display during its manufacture. FIG. 1 is a side perspective view of a passive matrix OLED display 100 midway in the manufacturing process. Display 100 includes a patterned anode layer 102 (typically the columns.) that are patterned into stripes on top of a substrate 101. Anode layer 102 is typically composed of a transparent conducting oxide such as ITO (Indium Tin Oxide) or Fluorine-doped Tin Oxide. After anode patterning (usually via a photolithography and etching step), metal lines (not shown) may be patterned upon part of the anode pattern using methods known to those of ordinary skill in the art (e.g. metal deposition, photolithography and/or etch).

Thereafter, cathode separators 110 are formed upon the surface of the substrate. These cathode separators are typically photo-resist layers that are patterned as shown using a photolithographic and etch step. Other steps such as pre-baking and post-baking and so on are well known in the art and will not be discussed in detail. One of the purposes of the cathode separators is to provide electrical separation of the individual rows of the top electrode layer, namely the cathode layer. The cathode layer is typically evaporated using a thermal or an electron-beam evaporation system or alternately it can be deposited using a sputtering system.

FIG. 1 depicts a metal cathode layer 104 that is laid down, typically on top of various polymer layers 108 and 109, to provide electrical connection for the active pixel area formed consequently. The intersection of cathode layer 104 and anode layer 102 creates a matrix of active pixels such as pixel 106 (shown with diagonal shading). The pixel 106 illuminates under an application of a forward biased voltage as discussed above. The polymer layers 108 and 109 are typically formed by depositing a gel or liquid substance and then spinning the OLED display 100 to spread out the deposited substance. This is referred to as spin coating. In other cases, the gel or liquid can be deposited and simply evaporated/dried for a period of time. In selective deposition techniques, such as inkjet printing (described below) pockets are formed into which the gel or liquid can be deposited drop by drop.

In the configuration shown, polymer layer 109 is usually an emissive polymer layer. Typically, polymer layer 108 is a conducting polymer layer which is also called a hole transport layer because it transports holes from the anode layer into the emissive polymer layer 109. The order in which layer 108 and 109 are deposited would be reversed if layer 104 were the anode layer and layer 102 the cathode layer. As mentioned above, one method of fabricating polymer layers is to drop a liquid or gel and allow it to dry. Typically, the polymer layers are deposited over the anode layer after the cathode separators have been fashioned. However, these cathode separators can often affect the spreading/flow/shape of the deposited polymers, especially in the case of selective deposition such as inkjet printing (discussed below). The polymer liquid or gel is deposited in drops and allowed to spread out on the exposed surface of the anode layer and then dry into a film.

This process/structure is slightly modified for an OLED display that is to have a pattern of pixels emitting different colors rather than a monochrome light emission. While spin coating of polymers may be appropriate for monochrome light emission, it is generally not used when a pattern of pixels of different colors is desired. For instance, if a particular pixel is to emit red light, a red emissive polymer material would be deposited in the region of that pixel, while for a blue emission a blue emissive polymer material would be deposited. In such cases, it is typical to have an extra layer of photo-resist other than the cathode separators that form "pockets" as shown in FIG. 2.

FIG. 2 illustrates an anode line 210 that has a layer of photo-resist 220 above it. The photo-resist 220 is patterned (in case of photolithography the photo-resist is developed away, while for screen printing, the photo-resist can be deposited where needed) to define a pocket 230 where the anode 210 is exposed. The pocket 230 defines an individual pixel region and defines an area upon which polymer layers can be deposited. Unlike the spin coating case, each pocket, thus formed, is isolated from the pocket of another pixel location in that the same substance dropped therein does not spread and overlap with that other pocket. FIG. 2 shows a cross-section cut in the same direction as the direction in which anode line 210 and other anode lines are patterned. A cross-section in the transverse direction to that shown in FIG. 2 would also show photo-resist with the same shape as photo-resist 220. This layer of photo-resist patterned as shown define individual pockets as illustrated in FIG. 3. The extra layer of photo-resist needed to define pockets usually has the shape shown in photo-resist 220 such that no portion of the photo-resist 220 overhangs into the pocket 230. The polymer(s) is/are dropped into the pocket 230 and allowed to dry or be evaporated.

In conjunction with these pockets, the process of inkjet printing has been used especially where a specific pattern of pixels are desired. For instance, in an OLED display where some individual pixel locations emit red light, while others emit green and yet others emit blue, inkjet printing would allow such a pattern to be created. FIG. 3 shows an inkjet printing system for an OLED that is to have RGB (red, green and blue) patterned pixels. The cross-section shown in FIG. 3 is perpendicular to the cross-section shown in FIG. 2 and is taken in a direction perpendicular to the direction in which anode lines 360 are patterned. A print head 350 contains different polymers or other organic or organo-metallic substances including a red light emissive polymer substance, a green light emissive polymer substance and a blue light emissive polymer substance. These three polymers substances are delivered, respectively, via nozzles 332, 322 and 312. (although it is possible to deposit a different material from each nozzle, industrial printers are not designed like that. Usually all nozzles are used to deposit one material and the different materials are deposited sequentially). When delivered, the polymer substances drop onto pockets formed over an anode layer 360 (or onto the conducting polymer layer 330 which may also have been dropped by the inkjet head 350). When the red, green and blue emissive polymer substances dry or evaporate, they form red polymer layer 334, green polymer layer 324 and blue polymer layer 314, respectively. One example shown is pocket 390 which has a green emitting polymer dropped therein to form green emitting polymer layer 324 (top view).

The red, green and blue pixels are patterned into a pattern 380 using photo-resist layer 340 which will ensure that the correct polymer substances are deposited into only that specific pocket of the OLED display which it defines. Pattern 380 is merely illustrative of one of many possible patterns of red, green and blue pixels. The use of a photo-resist layer to define pockets for inkjet printing is disclosed in published patent application Number US2002/0060518 A1 entitled "Organic Electroluminescent Device and Method of Manufacturing Thereof". As shown, the photo-resist 340 has a normal slope such that the top of the photo-resist 340 does not overhang the pocket. However, this configuration is not optimal, and can lead to non-uniform and concave drying patterns. The profile of this polymer, when dried from a liquid drop, will not be very flat or uniform.

As can be observed, the drying pattern is very non-uniform and shows a piling up on the edges of the drop 400. This is due to the difference in the rate of evaporation at different regions of the drop 400. This difference causes the substance to move towards the edges of the drop 400 from the middle, and hence the ultimate deposition of more of the substance at the edge than in the middle. This phenomenon is usually referred to as the Marangoni effect. A common example of this phenomenon is the drying of a coffee stain which shows more prominence (is darker in color) on the edges of the stain than in the center.

When there are normal sloping banks as in the case of drop 410, there is still substantial non-uniformity in the profile of the drop when dried. There is pileup at the edges which affects the useful part of the device. As the thickness of the layer 330 and 334 increases (see FIG. 3), the current through that part of the film decreases leading to less light being emitted from the part of the pocket with thicker layer(s) 330 and 334.

It would be desirable to optimize the shapes of the banks such that the drying polymers are more uniform in thickness and thus have a flatter profile than is traditionally observed.

SUMMARY

In accordance with the invention, the shapes of the photo-resist layer "banks" which define pockets for inkjet printing or other patterned processes are optimized to provide a more uniform drying profile for substances which are to be deposited in those pockets and then dried therein. Preferably, the configuration of the banks are "mushroom" shaped such that a portion of the photo-resist layer overhangs the exposed lower electrode layer. In one embodiment of the invention, the banks are trapezoidal in configuration such that the angle between the wall of the photo-resist bank and the lower electrode layer is less than or equal to ninety degrees. This configuration may be exhibited on any or all of the four bank walls which define a pocket. This configuration reduces the level of build-up on and near the walls of the banks and induces a more uniform and flatter profile when a substance dropped into a pocket is allowed to dry.

In other embodiments the banks are not trapezoidal in configuration. They are, like the trapezoidal configured mushroom banks, however, characterized by an overhang which covers part of the exposed lower electrode layer (when viewed from the top) such that the angle defined by 1) a line from the top point of the overhang of the mushroom bank to the base (where the mushroom bank meets the lower electrode layer) of the mushroom bank and 2) the top surface of the lower electrode layer is an angle measuring less than or equal to ninety degrees.

DETAILED DESCRIPTION OF THE INVENTION

In accordance with the invention, the shapes of the photo-resist layer "banks" which define pockets for inkjet printing or other patterned processes are optimized to provide a more uniform drying profile for substances which are to be deposited in those pockets. Preferably, the shapes of the banks are such that a portion of the photo-resist layer overhangs the exposed lower electrode layer. Due to this overhang feature, such banks are referred to as "mushroom" (or "undercut") banks. In one embodiment of the invention, the banks are trapezoidal in configuration such that the angle between the side wall of the photo-resist bank and the edge of the lower electrode layer which the side wall contacts is less than or equal to ninety degrees. This configuration may be exhibited on any or all of the four bank walls which define a pocket. This configuration reduces the level of build-up on and near the walls of the banks and induces a more uniform and flatter profile when a substance dropped into a pocket is allowed to dry.

In other embodiments the banks are not trapezoidal in configuration. They are, like the trapezoidal configured mushroom banks, however, characterized by an overhang which covers part of the exposed lower electrode layer (when viewed from the top) such that the angle defined by 1) a line from the top point of the overhang of the mushroom bank to the base (where the mushroom bank meets the lower electrode layer) of the mushroom bank and 2) a line drawn across the exposed lower electrode layer is an angle measuring less than or equal to ninety degrees.

In other embodiments of the invention, a process of fabricating an organic electronic device is disclosed whereby a layer of photo-resist banks are fabricated with portions thereof which overhang the lower electrode layer prior to organic substances being deposited in the pocket defined thereby. The organic substances are allowed to evaporate and dry into layers and the fabrication process is continued. For instance, in an OLED display, both a conducting polymer substance and an emitting polymer substance may be deposited into a pocket that is defined by the optimized banks and allowed to dry into a conducting polymer layer and an emitting polymer layer. The amount of substance deposited within the banks, as well as the composition (properties) of the deposited substance contribute to the drying profile and thus, are factors in determining the optimal shapes of the photo-resist banks. In addition, the materials used in constructing the banks and surface treatments on the lower electrode layer and the bank layer (or already deposited polymer layer) may affect the rate/direction of spread, affinity, etc. of the dropped substance and therefore, the drying profile of the resulting film.

Figure 1:
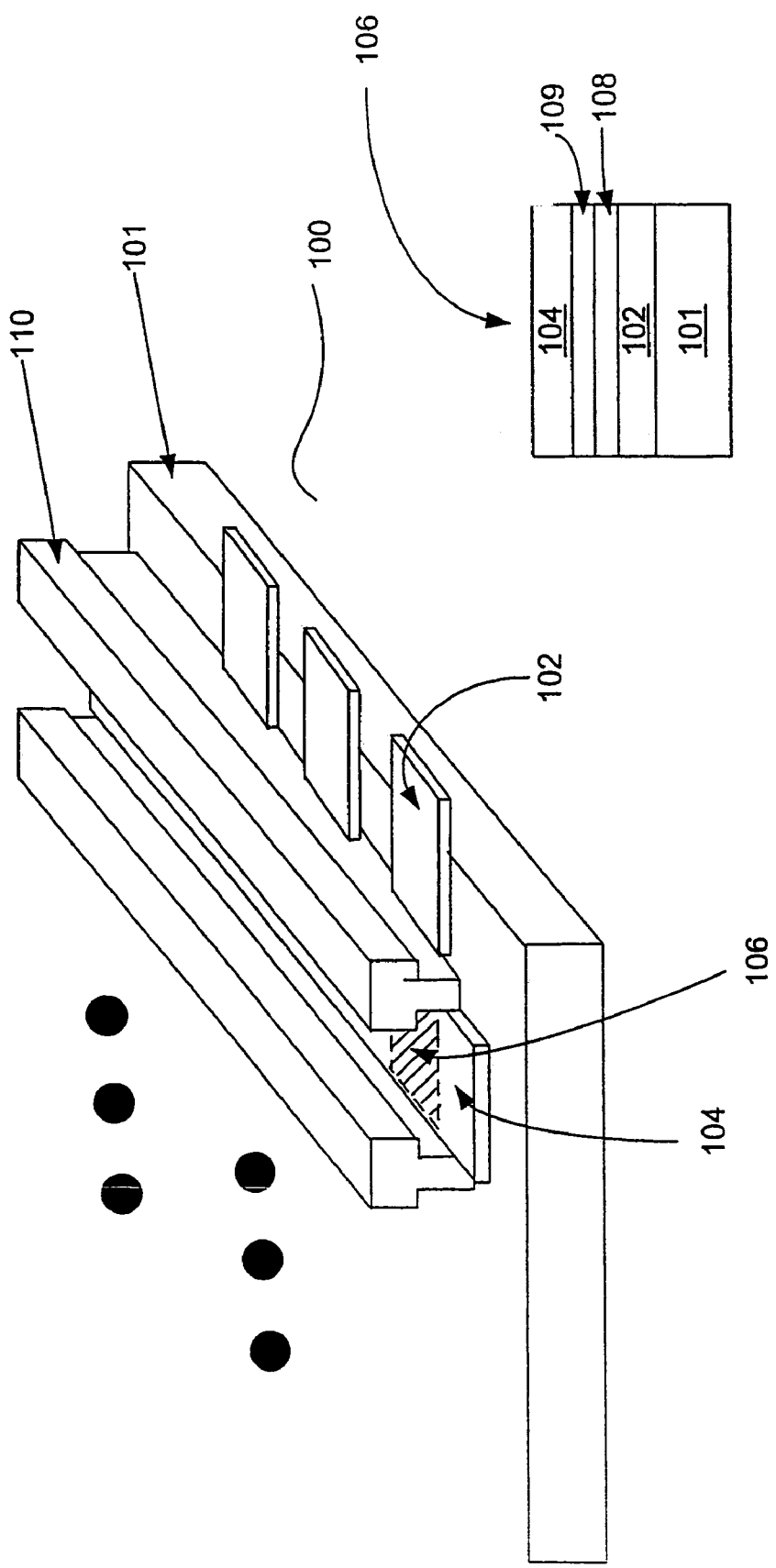
FIG. 1 illustrates a display device composed of OLED pixels under manufacture.
Figure 2:
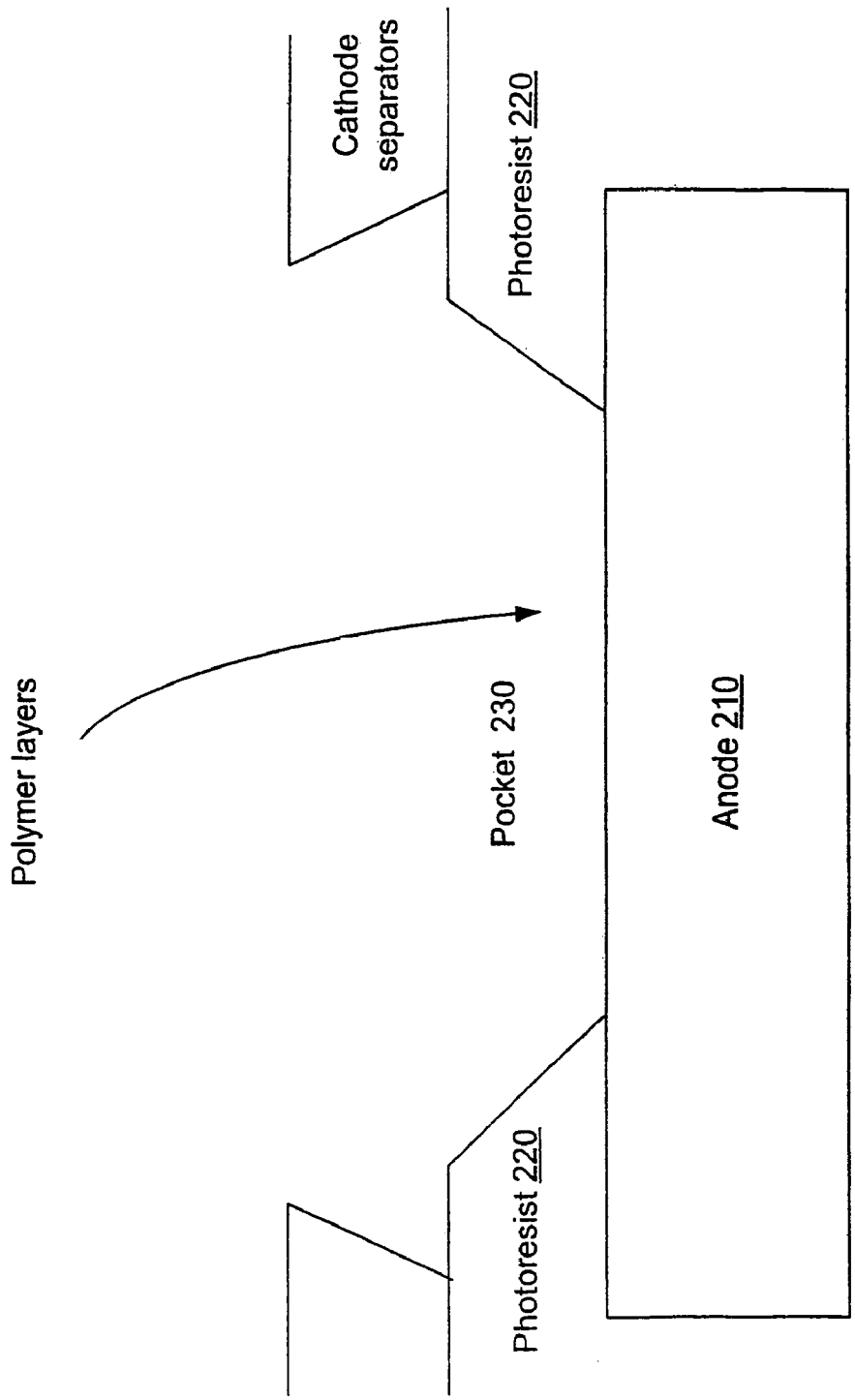
FIG. 2 pockets defined by a layer a photo-resist in an electronic device under fabrication.
Figure 3:
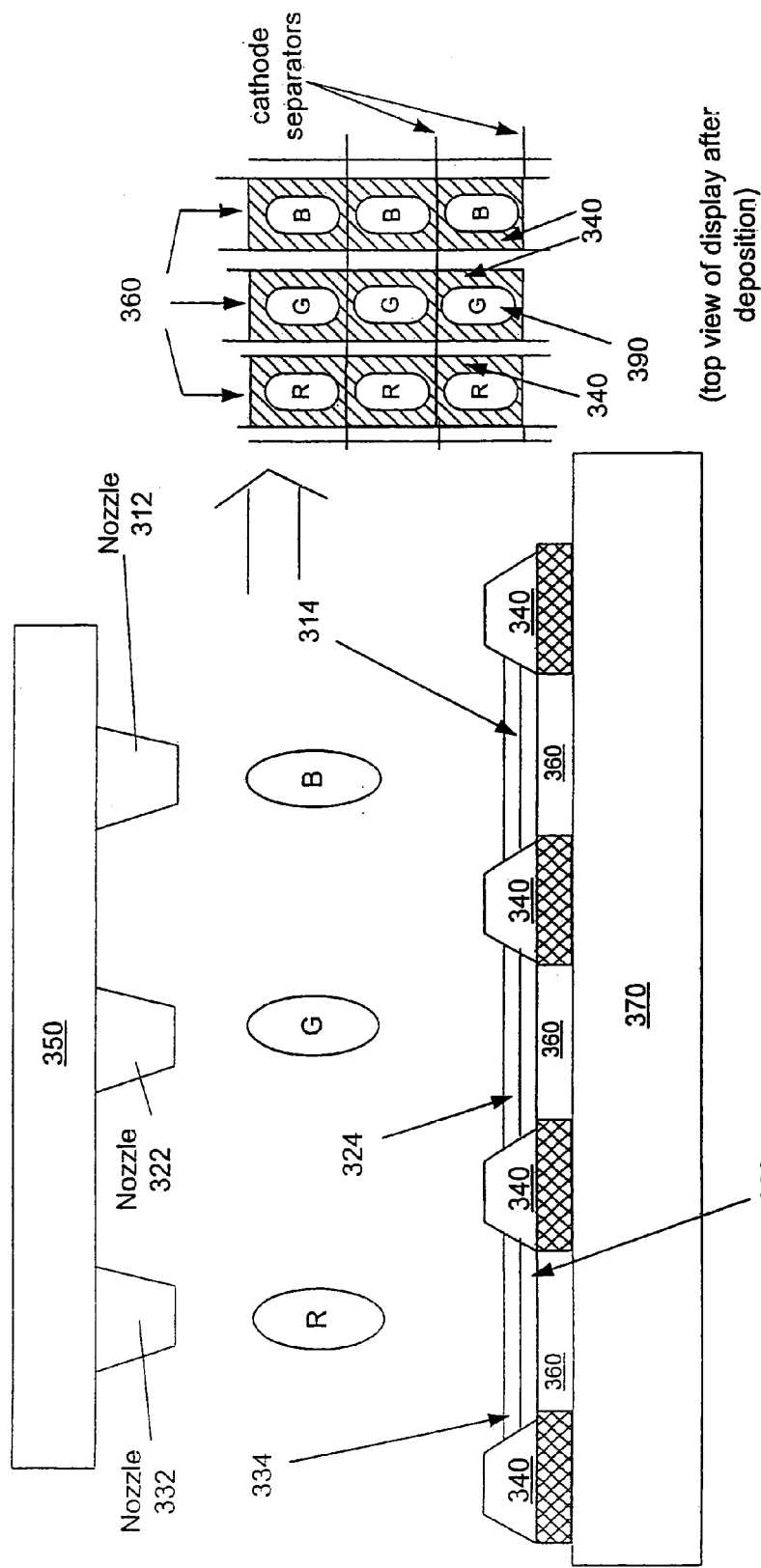
FIG. 3 illustrates an example of a inkjet printing system for fabricating patterned surfaces.
Figure 4:
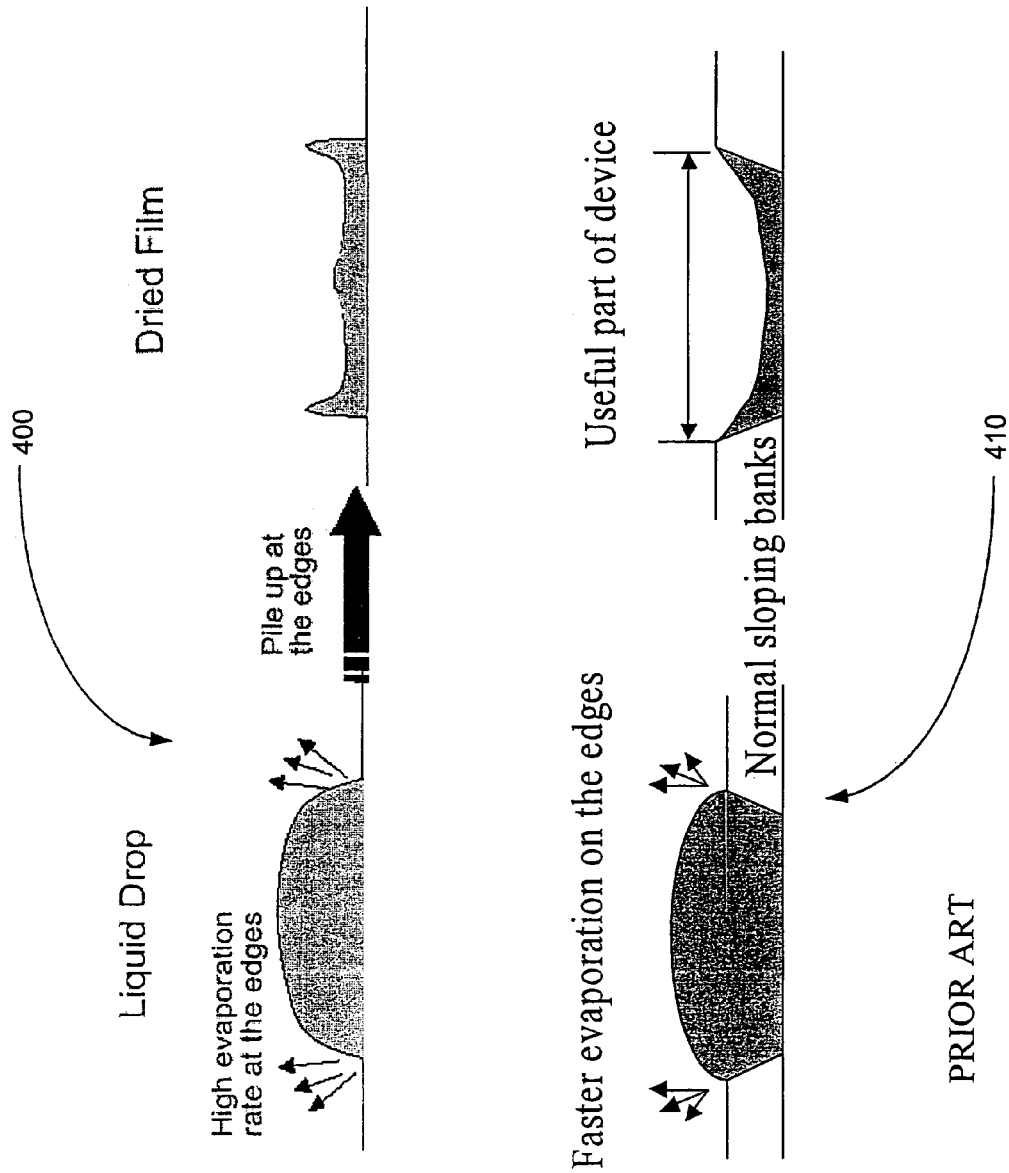
FIG. 4 illustrates the drying pattern of a liquid substance when the substance is dropped with and without banks.
Figure 5:
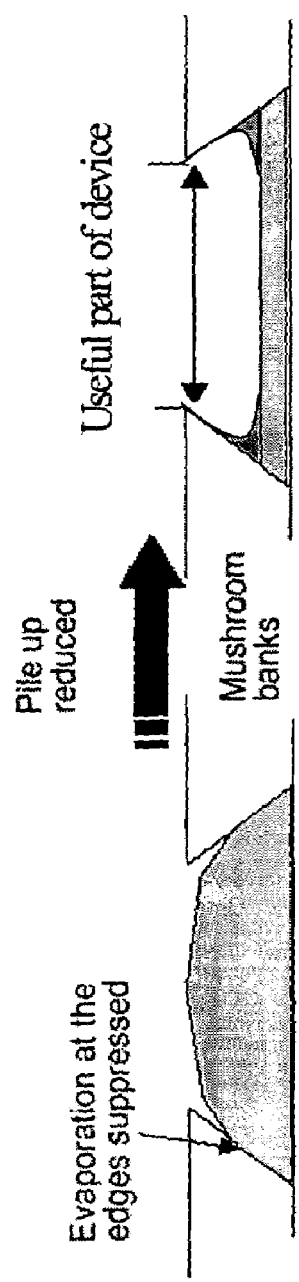
FIG. 5 illustrates the drying profile of a substance dropped into mushroom banks in accordance with the invention.

FIG. 5 illustrates the drying profile of a substance dropped into mushroom banks in accordance with the invention. The mushroom bank shown has a trapezoidal configuration and the angle between the lower electrode layer and the wall of the mushroom bank is an acute angle i.e. less than ninety degrees. The decreased rate of evaporation or drying of the liquid drop reduces the temperature drop at the edges (where the drop touches the walls) thus negating the increased surface tension seen at the edges caused by a temperature reduction due to the latent heat of vaporization. (since surface tension is inversely proportional to temperature). This is one contributing factor to the above-mentioned Marangoni effect. The decreased surface tension prevents the liquid from flowing to its edges and thus, even though the rate of evaporation is slightly reduced, there is less pile-up or build up of the drying substance at the edges. The overall effect that has been observed in experiments is a flattening the drying profile making the thickness of the dried liquid more uniform over the useful area of the pocket. With a mushroom bank, while there is some build up at the edges, it is less than with normal sloping banks and is not in the useful area of the device, and hence, not detrimental to the operation of the device once fabrication is complete. The liquid substance is assumed in this example to have spread or be of sufficient volume to contact the side walls of the mushroom banks as shown.

Figure 6:
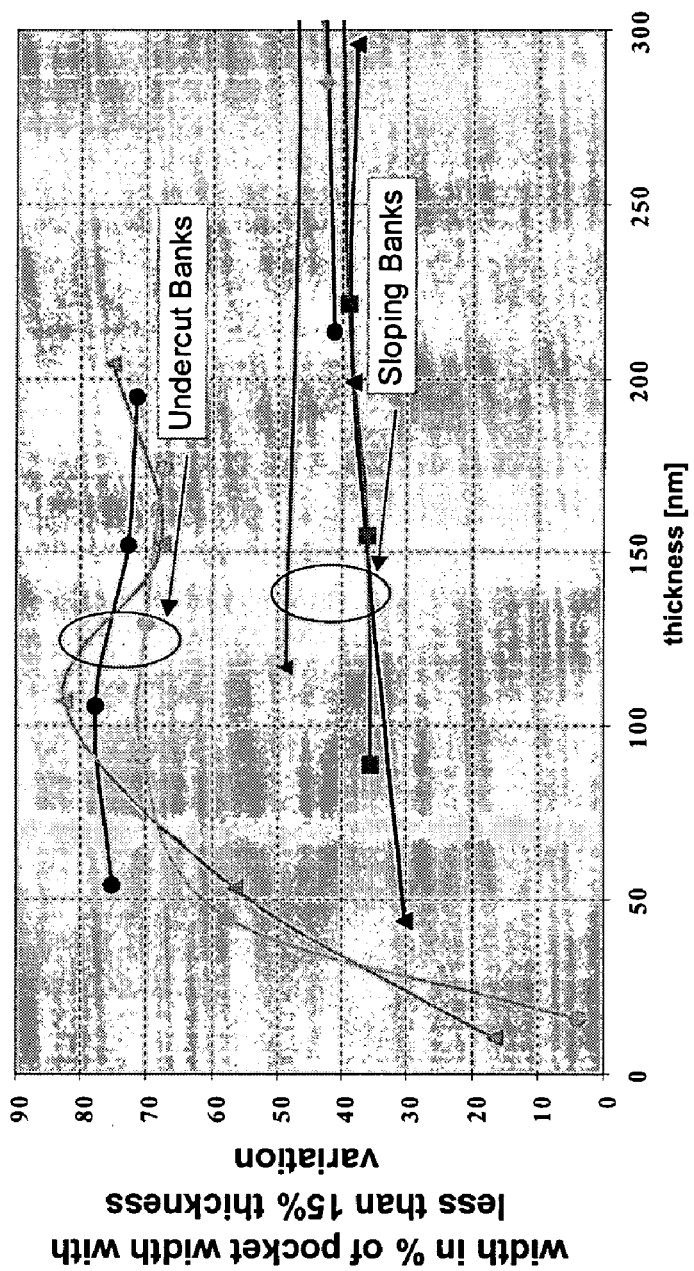
FIG. 6 illustrates the results of experiments carried out on drying liquid films for pockets defined by both normal sloping banks and undercut "mushroom" banks.

FIG. 6 illustrates the results of experiments carried out on drying liquid films for pockets defined by both normal sloping banks and undercut "mushroom" banks. The vertical axis of graph 600 is the percentage of the width of the pocket where the variation in thickness fell within a tolerance of 15% (of the minimum film thickness seen in the pocket). The horizontal axis is a measure of the thickness of the film samples under experiment. As can be observed, at thicknesses of approximately 50 nanometers and higher, the use of normal sloping banks showed that only 30–40% of the entire width of the film had an acceptable (less than 15%) thickness variation. This was the case even as the thickness of the film was increased greatly. In other words, the addition of extra amounts of liquid substance had little effect on the uniformity that was achievable.

By contrast, drops of liquid dried into films in pockets shaped by undercut (mushroom) banks had a greater percentage of the width of the dried film falling within the acceptable tolerance of a 15% thickness variation. In one set of samples, all thicknesses of films between 50–200 nanometers exhibited more than 70% of those films having a uniform thickness (within the tolerance of 15%). Other sample sets showed on average that 70% of the width of the film had a thickness variation within 15% across it.

Figure 7:
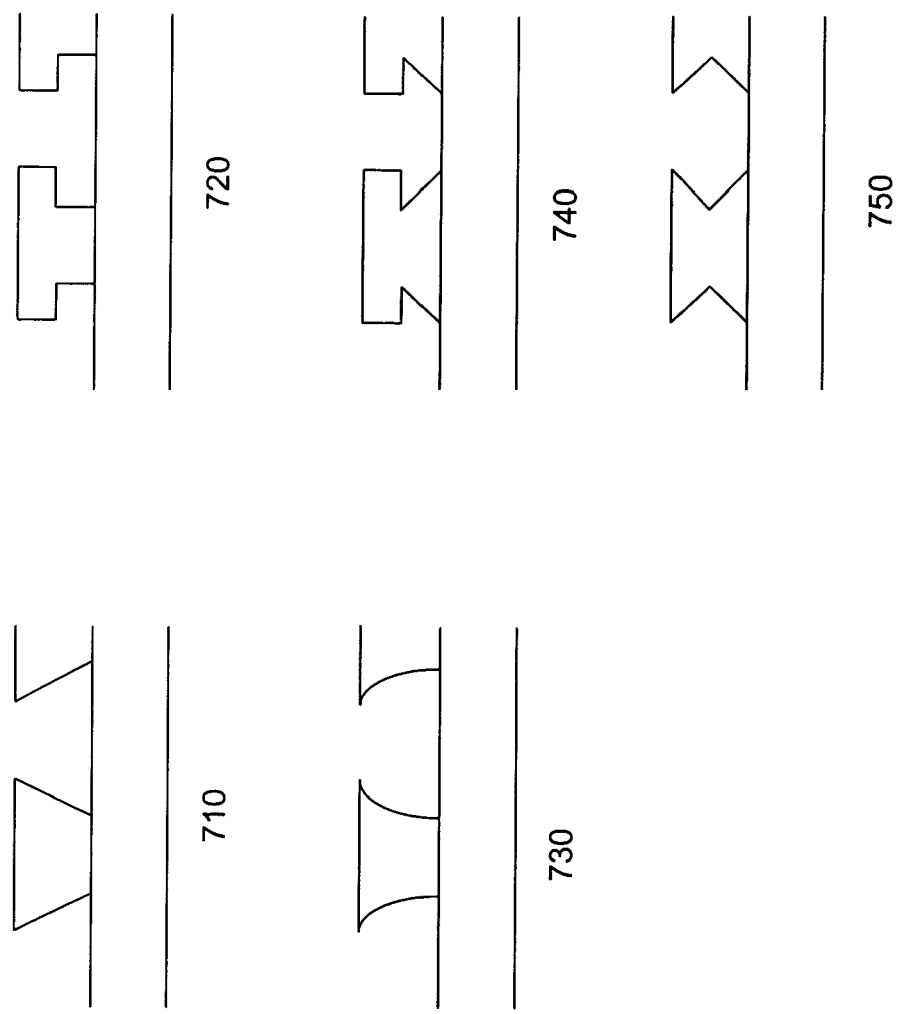
FIG. 7 illustrates different bank shapes which could be used to define pockets according to the invention.

FIG. 7 illustrates different bank shapes which could be used to define pockets according to the invention. Mushroom banks 720 have square edges while others such as banks 710 and 750 may have edges at acute angles to the layer on which they are patterned. A mixture of square and angled edges is exhibited by banks 740. Banks 730 have curved edges. In practice, the shape of the banks, as constructed, may not be sharp or uniform, but may have transitions, jagged edges, curves and other such non-conformities. Ordinarily, the mushroom banks might have slightly rounded edges rather than the ideal sharp edges pictured. In each case, the banks have a portion which would overhang into the region over which they are patterned. In the case of inkjet pockets, there would be a region of the pocket which is "undercut" by the bank, hence the term "undercut" bank is also used. The banks can be constructed as a single piece or in layers whichever is more desirable in terms of cost, time and complexity of process. In each case, mushroom banks have a top portion which overhangs the pocket. The angle defined by 1) a line drawn from the top point of the overhang of the mushroom bank, regardless of the specific shape or configuration, and the "base" (the portion which abuts the lower electrode layer) of the mushroom bank and 2) the lower electrode layer is less than or equal to ninety degrees.

As mentioned, the mushroom or undercut banks may be present on only two sides or on all four sides of the pocket that is formed. In either case, some of the sides of the pocket may have banks of a first shape while others have different shapes. Preferably, all of the four sides of the pocket would have uniform banks so that the effect of the drying of substances deposited therein is more predictable. The banks can be formed of a great variety of materials, including, for instance nitrides and oxides of silicon.

Figure 8:
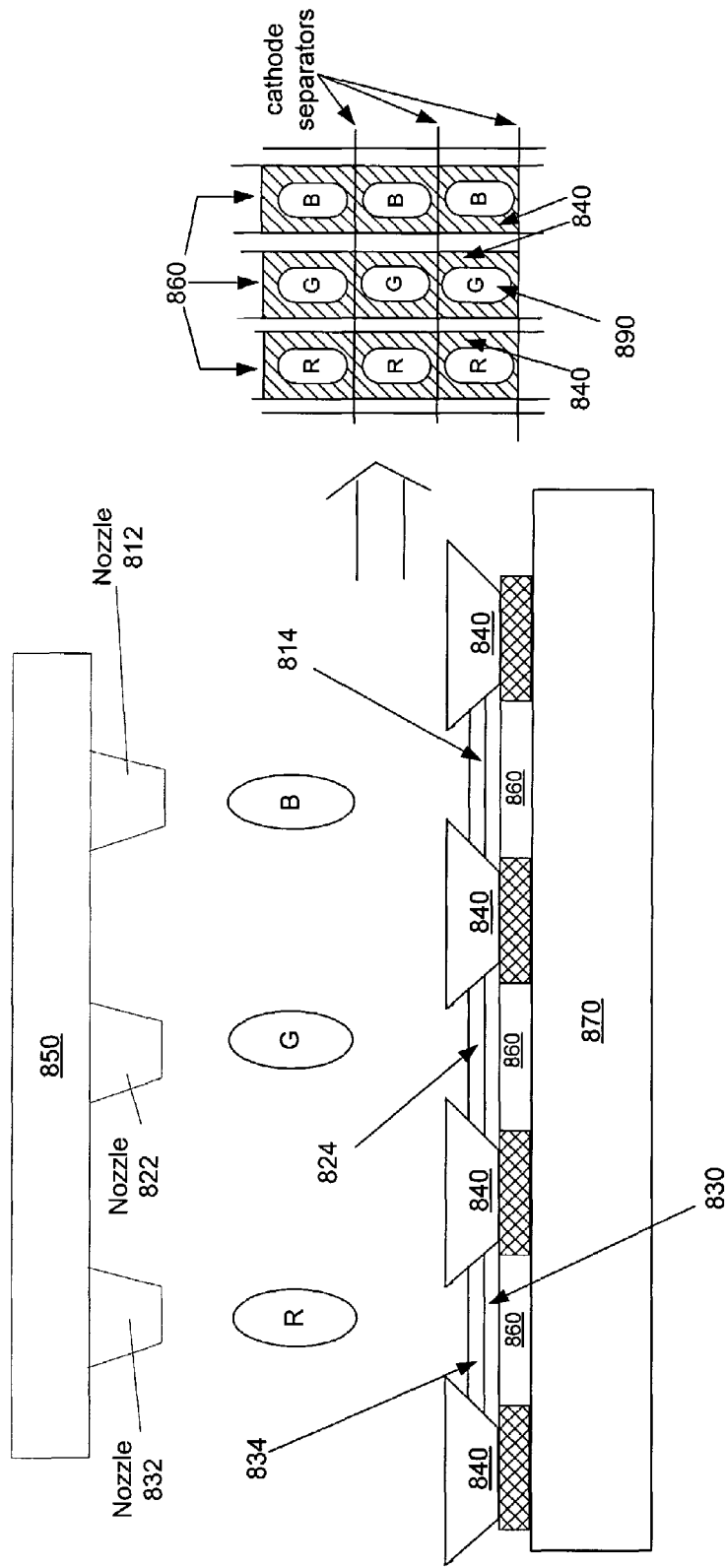
FIG. 8 shows an inkjet printing system in accordance with the invention for an OLED that is to have RGB (red, green and blue) patterned pixels.

FIG. 8 shows an inkjet printing system in accordance with the invention for an OLED that is to have RGB (red, green and blue) patterned pixels. The cross-section section shown in FIG. 8 is taken in a direction perpendicular to the direction in which the anode (or other lower electrode layer) lines are patterned. A print head 850 contains different polymers or other organic or organo-metallic substances including a red light emissive polymer substance, a green light emissive polymer substance and a blue light emissive polymer substance. These three polymers substances are delivered, respectively, via nozzles 832, 822 and 812. When delivered, the polymer substances drop onto pockets formed over an anode layer 860 (or onto the conducting polymer layer 830). When the red, green and blue emissive polymer substances dry or evaporate, they form red polymer layer 834, green polymer layer 824 and blue polymer layer 814, respectively. The red, green and blue pixels are patterned into a pattern 880 using photo-resist layer 840 which defines pockets (such as pocket 890) will ensure that the correct polymer substances are deposited into only that specific pocket of the OLED display which it defines. One example is shown in pocket 890 which has a green emitting polymer dropped therein. In accordance with the invention, the photo-resist banks 840 have a mushroom configuration and overhang into the pockets that they define. This results in the emissive polymer layers 834, 824 and 814 having a more flat profile when dried such that the variation in thickness across each of these layers is not great.

In order to ensure a flat shape however, it is also important that any layers under the emissive polymer layers also have a flat profile and uniform thickness. Thus, the conducting polymer layer 830 which could ordinarily be spin coat over the anode layer 860 can also be delivered via the inkjet system shown. Though typically designed to hold only one substance at a time, the print head 850 could contain both the substances for the emissive polymer layers 834, 824, and 814 as well as the substance for the conducting polymer layer 830. The conducting polymer layer 830 would be delivered via nozzles 832, 822 and 812 prior to the emissive polymer layers 834, 824 and 814 being delivered. The photo-resist mushroom banks 840 would be fabricated prior to any of the polymer layers 830, 834, 824, and 814 being delivered by inkjet print head 850. As shown in the top view, cathode separators may also be already fabricated/patterned in anticipation of the cathode layer that would later be deposited over the polymer layers.

The inkjet print head 850 is moved (or the OLED display being fabricated is moved) such that it is positioned above a new pocket or set of pockets of the display. The deposition and drying of the conducting polymer and emissive polymer substances is repeated for the new pocket or set of pockets. This process when repeated over the entire display will yield a patterned or pixilated display device. In alternate embodiments, keeping with the standard design of inkjet heads that hold only one substance at a given time, the conducting polymer substance can be deposited in all pockets prior to any of the emissive polymers being deposited using the same or different print head).

In still other embodiments, the order of the conducting and emissive polymers may be transposed if the anode layer 860 were instead a cathode layer. In such cases, the mushroom banks would be formed upon the cathode layer which would be the lower electrode layer.

Figure 9:
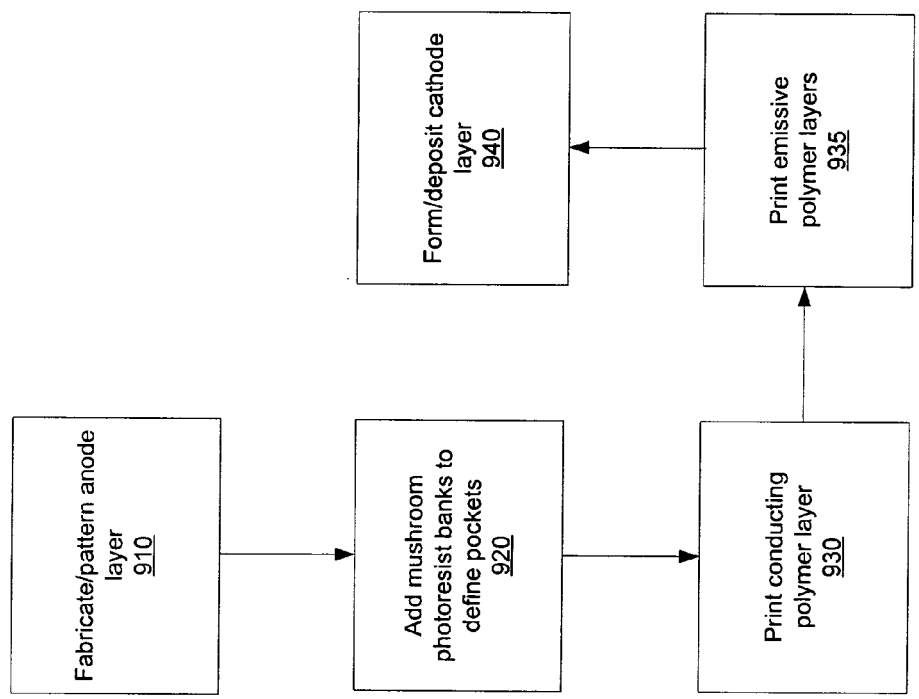
FIG. 9 shows a detailed workflow of fabricating an OLED in accordance with the invention.

A detailed workflow of fabricating an OLED in accordance with the invention is shown in FIG. 9. First, an anode layer is fabricated/patterned over a substrate (step 910). The substrate may be made of materials such as glass, quartz, silicon, plastic and so on in a single plate. Typical anode materials include metals (e.g. aluminum, silver, copper, indium, tungsten, lead etc.); metal oxides; graphite; doped inorganic semiconductors (such as doped silicon, gallium arsenide and the like); and doped conducting polymers (such as polyaniline, polythiopene and the like). The anode layer is usually thin enough so as to be semi-transparent and allow at least a fraction of light to transmit through. As such, any thin-film deposition method may be used in the fabricating step 910. These include, but are not limited to, vacuum evaporation, sputtering, electron beam deposition, chemical vapor deposition, etching and other techniques known in the art and combinations thereof. The process also usually involves a baking or annealing step in a controlled atmosphere to optimize the conductivity and optical transmission of anode layer. Photolithography is then used to define the pattern in the anode lines. Other steps (not shown) like adding metal lines to connect the anode lines to power sources may also be included in the workflow. Generally, the workflow of FIG. 9 is not intended to be all-inclusive and is merely exemplary. For instance, after the OLED is fabricated it is often encapsulated to protect the layers from environmental damage or exposure. Such other processing steps are well-known in the art and are not a subject of the invention.

Figure 10:
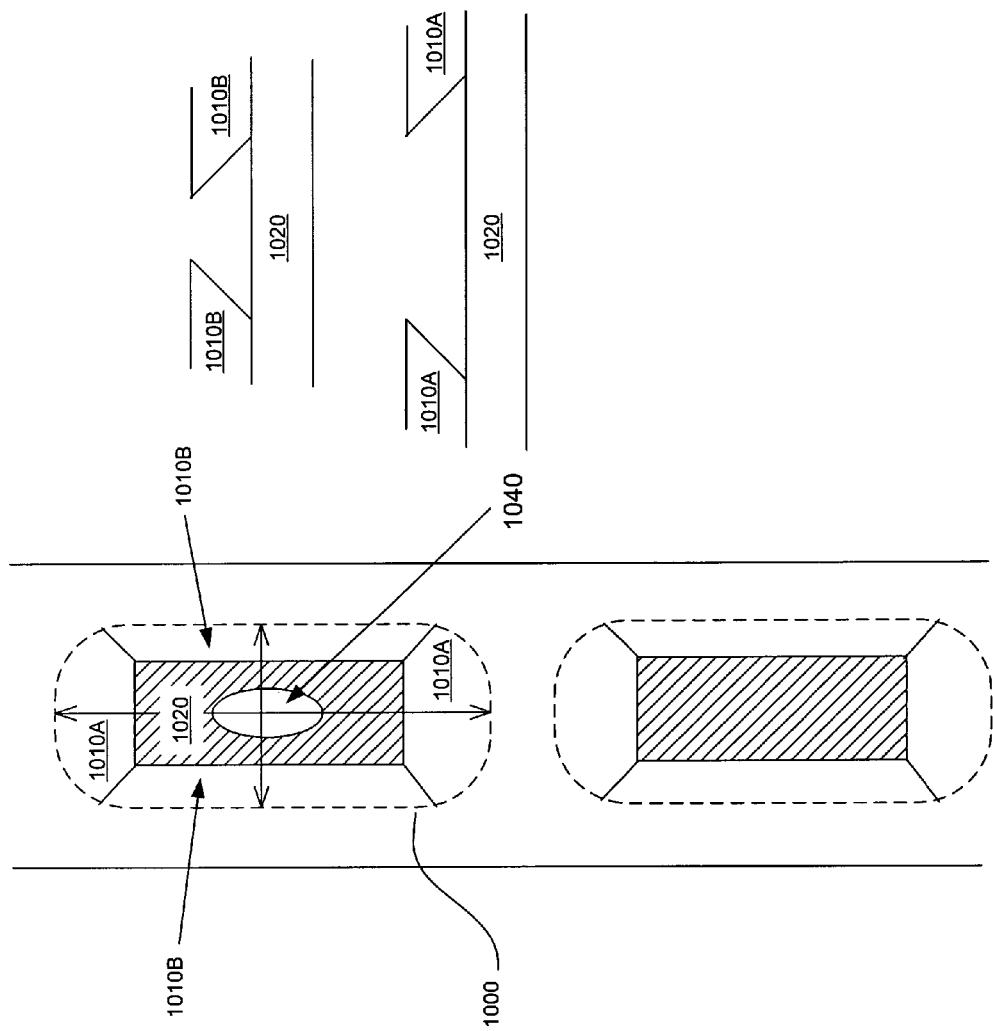
FIG. 10 illustrates a pocket defined by mushroom bank photo-resist in accordance with the invention.

In accordance with the invention, the next step is to add mushroom banks such that pockets in the anode layer are defined (step 920). The mushroom banks are fabricated by applying lithography techniques to a photo-resist material (or by using screen printing or flexo-graphic printing to deposit the bank material in the desired pattern). FIG. 10 illustrates mushroom banks which define a pocket in accordance with the invention. Photo-resist material is usually classified in two types, either positive or negative. Positive photo-resist is photo-resist which dissolves wherever exposed to light. Negative photo-resist is photo-resist which dissolves everywhere except where exposed to light. Using light radiation and techniques such as chemical developing, the photo-resist can be patterned into the desired mushroom bank shape. Examples of negative photo-resist material include AZ 5214E manufactured by Clariant. Either positive or negative photo-resist can be used as desired in forming the mushroom banks. Photo-resist chemistry and processes such as lithography, baking, developing, etching and radiation exposure which can be used in patterning the photo-resist into mushroom banks are known to those skilled in the art.

Next, the conducting polymer layer is printed (step 930). The conducting polymer layer is used to enhance the hole yield of the OLED relative to the potential applied across it and thus, aids in more energy-efficient injection of holes into the emissive polymer layer for recombination. The conducting polymer layer is sometimes applied as solution and laid down using techniques such as spin coating, dip coating, roll coating, spray coating or thermal evaporation. In accordance with the invention, the conducting polymer layer is applied using printing techniques such as inkjet printing (screen printing, flexo-graphic printing). Particularly, in this instance, the conducting polymer layer is printed onto the anode layer in pockets defined by mushroom banks of photo-resist. The conducting polymer layer is printed by depositing a liquid substance containing the conducting polymer into the pocket and allowing the substance to dry. The dried film then represents the conducting polymer layer. The conducting polymer layer is a p-type material that transports holes effectively to the emissive polymer layer.

The conducting polymer layer is also referred to as a hole transport layer ("HTL"). The conducting polymer layer is used to improve, for example, the charge balance, the display stability, the turn-on voltage, the display brightness, the display efficiency, and the display lifetime. The conductivity of this layer is controlled by doping of the polymer layer. By controlling the doping concentration, the conductivity of the layer can be controlled. The conductive polymer layer can be formed from, for example, a solution comprised of water, polyethylenedioxythiophene ("PEDOT"), and polystyrenesulfonic acid ("PSS") (this solution is referred to, herein, as a PEDOT:PSS solution).

Then according to step 935, the emissive polymer layers are printed. The emissive polymer layer is primarily responsible for the emission of light from the OLED and is thus a electroluminescent, semi-conducting and organic (organometallic) type material.

Emissive polymers include the various families, copolymers, derivatives and moieties of polyfluorene, polyphenylenevinylene, polyarylenevinylene, polyquinoline, and so on. Examples of such organic electroluminescent materials that may make up the emissive polymer layer include:

(i) poly(p-phenylene vinylene) and its derivatives substituted at various positions on the phenylene moiety;

(ii) poly(p-phenylene vinylene) and its derivatives substituted at various positions on the vinylene moiety;

(iii) poly(p-phenylene vinylene) and its derivatives substituted at various positions on the phenylene moiety and also substituted at various positions on the vinylene moiety;

(iv) poly(arylene vinylene), where the arylene may be such moieties as naphthalene, anthracene, furylene, thienylene, oxadiazole, and the like;

(v) derivatives of poly(arylene vinylene), where the arylene may be as in (iv) above, and additionally have substituents at various positions on the arylene;

(vi) derivatives of poly(arylene vinylene), where the arylene may be as in (iv) above, and additionally have substituents at various positions on the vinylene;

(vii) derivatives of poly(arylene vinylene), where the arylene may be as in (iv) above, and additionally have substituents at various positions on the arylene and substituents at various positions on the vinylene;

(viii) co-polymers of arylene vinylene oligomers, such as those in (iv), (v), (vi), and (vii) with non-conjugated oligomers; and (ix) polyp-phenylene and its derivatives substituted at various positions on the phenylene moiety, including ladder polymer derivatives such as poly(9,9-dialkyl fluorene) and the like;

(x) poly(arylenes) where the arylene may be such moieties as naphthalene, anthracene, furylene, thienylene, oxadiazole, and the like; and their derivatives substituted at various positions on the arylene moiety;

(xi) co-polymers of oligoarylenes such as those in (x) with non-conjugated oligomers;

(xii) polyquinoline and its derivatives;

(xiii) co-polymers of polyquinoline with p-phenylene substituted on the phenylene with, for example, alkyl or alkoxy groups to provide solubility; and (xiv) rigid rod polymers such as poly(p-phenylene-2,6-benzobisthiazole), poly(p-phenylene-2,6-benzobisoxazole), poly(p-phenylene-2,6-benzimidazole), and their derivatives.

Another example of a poly-fluorene based organic electroluminescent material that emits green light is the Lumation Green 1300 series from Dow Chemical, Midland, Mich.

In inkjet printing, there may be a plurality of different emissive polymer substances. For instance, there may be red, green and blue emitting emissive polymers in the print head which are deposited depending upon the desired color to be emitted in a given pixel location which is defined by a pocket. The emissive polymer layers are printed above the conducting polymer layer and in much the same fashion.

The emitting polymer substances are deposited on the conducting polymer layer by the print head in the exact area defined by the pockets (which are defined by the mushroom bank photo-resist in accordance with step 920). The emissive polymer layer results from the drying of the substance deposited by the print head.

Both the conducting polymer layers and emissive polymer layers can be printed by depositing a liquid in between the photo-resist banks which define a pocket. This liquid may be any "fluid" or deformable mass capable of flowing under pressure and may include solutions, inks, pastes, emulsions, dispersions and so on. The liquid may also contain or be supplemented by further substances which affect the viscosity, contact angle, thickening, affinity, drying, dilution and so on of the deposited drops.

After the emissive polymer layer is printed, the cathode layer is formed/deposited (step 940). The cathode layer is typically a combination of a layer of pure metal and a lower-work function metal or metal oxide. While the cathode layer can be comprised of many different materials, preferable materials include aluminum, silver, magnesium, calcium, barium, or combinations thereof. More preferably, the cathode layer is comprised of aluminum, aluminum alloys, or combinations of magnesium and silver. Low work function material which may combined with a pure element/metal include oxides such as cesium oxide or barium oxide. Insulating materials such as LiF, NaF, CsF and so on may also be used below the metal layer to enhance injection by tunneling. The cathode layer is formed/deposited typically using vacuum evaporation or similar techniques and often using specially designed deposition devices. Often other steps such as the addition of masks and photo-resists may precede the cathode deposition step 940. However, these are not specifically enumerated as they do not relate specifically to the novel aspects of the invention.

FIG. 10 illustrates a pocket defined by mushroom bank photo-resist in accordance with the invention. The mushroom banks 1010A and 1010B overhang into the pocket that is being defined and exposes only part of the lower electrode layer 1020 below it. The banks 1010A and 1010B are each a pair of trapezoidal-configured photo-resist layers. The dashed lines indicate that the mushroom bank photo-resist has a base that extends into the pocket. As shown, the mushroom banks 1010A and 1010B together surround all four sides of the defined pocket 1000. From a top-view as shown, only the shorter edges of the trapezoids that make up the mushroom bank are visible. To illustrate the shape of the walls of the mushroom banks 1010B, a cross-section taken in the longitudinal direction of pocket 1000 without the presence of drop 1040 is also shown in FIG. 10. In a like fashion, a cross-section taken in the traverse direction is shown to illustrate the shape of the walls of mushroom banks 1010A.

A liquid drop 1040 such as a polymer substance spreads out toward the hidden-from-view base of the mushroom banks 1010A in the longitudinal direction of the pocket 1000. Likewise, drop 1040 spreads out toward the hidden-from-view base of the mushroom banks 1010B in the traverse direction of the pocket 1000. This is indicated in FIG. 10 by double-sided arrows which show the direction of spreading of the drop 1040. The direction of spreading need not be exact, and in reality, the drop 1040 would likely spread in all directions and may not contact the walls of the banks 1010A and 1010B (as shown by the arrows). This can be controlled by ensuring that the substances of which drop 1040 is made are such that they would spread to cover the pocket 1000 and make contact with banks 1010A and 1010B. In addition, a number of other drops such as drop 1040 can be added one upon the other and/or in different regions of the pocket 1000 such that the coalesced substance spreads as desired.

In one application, the thickness of the mushroom bank 1010 is less than ten microns, preferably less than three microns and can be as low as 0.5 microns. Typical sizes for the pockets are a width of 75 microns and a length of over 200 microns. Though only one drop is shown, typically more than one drop is deposited in a given pocket. There can be as many as 10–20 drops (the number of drops dependent in part on diameter and solid material content of the drops) deposited into a pocket, with each drop having a diameter of 10 to 50 microns.

In other embodiments of the invention, as discussed, the configuration of the mushroom banks 1010A and 1010B may be in the form of a T or other shape with an overhang feature. A sample of possible such shapes are shown in FIG. 7 and described above. Further, in other embodiments of the invention, banks 1010A may have one configuration while banks 1010B have yet another. According to the invention, however, at least one of the banks should have a mushroom configuration.

While the embodiments of the invention are illustrated in which it is primarily incorporated within an OLED display, almost any type of electronic device that uses dried film layers may be potential applications for these embodiments. In particular, present invention may also be utilized in a solar cell, a transistor, a phototransistor, a laser, a photo-detector, or an opto-coupler. It can also be used in biological applications such as bio-sensors or chemical applications such as applications in combinatorial synthesis etc. The OLED display described earlier can be used within displays in applications such as, for example, computer displays, information displays in vehicles, television monitors, telephones, printers, and illuminated signs.

What is claimed is:

1. An organic light emitting diode (OLED) device with at least one pixel, comprising:
   a lower electrode layer;
   a photo-resist layer, said photo-resist layer fabricated upon said lower electrode layer, said photo-resist layer patterned into a plurality of mushroom banks to define at least one pocket upon said lower electrode layer, the mushroom banks having a lower portion and an upper portion, where the lower portion is closer to the lower electrode layer than the upper portion and at least part of the upper portion is wider than at least part of the lower portion, the pocket completely surrounding and defining an active region of the pixel, so that the pixel is surrounded by the mushroom banks on all sides;
   a plurality of polymer layers in the pocket; and
   an upper electrode layer patterned above said polymer layers, said upper and lower electrode layers capable of conducting electrical energy to said polymer layers to cause at least one of said polymer layers to emit light.

2. A device according to claim 1 wherein said mushroom banks overhang a portion of the lower electrode layer.

3. A device according to claim 2 wherein said polymer layers include at least partially organic materials.

4. A device according to claim 2 wherein said polymer layers include:
   a conducting polymer layer which is capable of transporting electrical energy; and
   an emitting polymer layer for emitting light upon activation by said electrical energy.

5. A device according to claim 4 wherein the emitting polymer is capable of emitting in one of white, red, green or blue.

6. A device according to claim 5 wherein the configuration of the mushroom banks is selected according to the properties of the polymer layers.

7. A device according to claim 1 wherein the configuration of said mushroom banks is trapezoidal.

8. A device according to claim 1 wherein said polymer layers have a substantially flat and substantially uniform profile.

9. A device according to claim 1 wherein the configuration of the mushroom banks is T-shaped.

10. A device according to claim 1 wherein the configuration of said mushroom banks is such that the walls of the mushroom banks are curved.

11. A device according to claim 4 wherein said lower electrode layer is an anode layer and said upper electrode layer is a cathode layer.

12. A device according to claim 1 wherein the configuration of the mushroom banks includes a plurality of different shapes coalesced together.

13. A method of fabricating an organic electronic device with at least one pixel, said method comprising:
    patterning a lower conducting layer upon a substrate;
    fabricating a photo-resist layer upon said lower electrode layer, said photo-resist layer patterned into a plurality of mushroom banks to define at least one pocket upon said lower electrode layer, each pocket surrounding and defining the active region of the pixel so that the pixel is surrounded by the mushroom banks on all sides, wherein the mushroom banks have a lower portion and an upper portion, where the lower portion is closer to the lower electrode layer than the upper portion and at least part of the upper portion is wider than at least part of the lower portion;
    depositing at least one liquid substance into said pocket;
    allowing said liquid substance to dry into polymer layers composed of organic material; and
    forming a patterned upper electrode layer above said polymer layers, said upper and lower electrode layers capable of conducting electrical energy to to said polymer layers to cause at least one of said polymer layers to emit light.

14. A method according to claim 13 wherein said mushroom banks overhang a portion of said lower conducting layer.

15. A method according to claim 13 wherein said organic electronic device is an organic light emitting diode (OLED) display.

16. A method according to claim 15 wherein each said pocket defines a pixel of said display.

17. A method according to claim 16 wherein said liquid substance includes an emissive polymer, said emissive polymer capable of emitting light upon application of electrical energy thereto, and said layers including an emissive polymer layer.

18. A method according to claim 17, wherein said at least one liquid substance includes a conducting polymer, the method further comprising allowing said conducting polymer substance to dry into a conducting polymer layer, said conducting polymer layer disposed upon said emissive polymer layer.

19. A method according to claim 13 wherein the configuration of said mushroom banks is trapezoidal.

20. A method according to claim 13 wherein said substance when dried has a substantially flat and substantially uniform profile.

21. A method according to claim 13 wherein the configuration of the mushroom banks is T-shaped.

22. A display according to claim 13 wherein the configuration of said mushroom banks is such that the walls of the mushroom banks are curved.

23. A method according to claim 13 wherein said fabricating the photo-resist layer including mushroom banks includes using lithographic processes.

24. A method according to claim 13 wherein the configuration of mushroom banks includes a plurality of different shapes coalesced together.

25. An organic light emitting diode (OLED) device comprising at least one pixel, comprising:
   a lower electrode layer;
   a photo-resist layer, said photo-resist layer fabricated upon said lower electrode layer, said photo-resist layer patterned into a plurality of mushroom banks to define at least one pocket upon said lower electrode layer, the mushroom banks having a lower portion and an upper portion, where the lower portion is closer to the lower electrode layer than the upper portion and at least part of the upper portion is wider than at least part of the lower portion, the pocket completely surrounding and defining an active region of the pixel;
   a plurality of polymer layers, wherein the wider part of the upper portion of the mushroom banks extends over an edge of at least one of the plurality of polymer layers; and
   an upper electrode layer patterned above said polymer layers, said upper and lower electrode layers capable of conducting electrical energy to said polymer layers to cause at least one of said polymer layers to emit light.

* * * * *